(12) United States Patent
Li

(10) Patent No.: US 10,446,652 B2
(45) Date of Patent: Oct. 15, 2019

(54) SEMICONDUCTOR DEVICE AND FABRICATION METHOD THEREOF

(71) Applicants: Semiconductor Manufacturing International (Shanghai) Corporation, Shanghai (CN); Semiconductor Manufacturing International (Beijing) Corporation, Beijing (CN)

(72) Inventor: Yong Li, Shanghai (CN)

(73) Assignees: Semiconductor Manufacturing International (Shanghai) Corporation, Shanghai (CN); Semiconductor Manufacturing International (Beijing) Corporation, Beijing (CN)

( * ) Notice: Subject to any disclaimer, the term of this patent is extended or adjusted under 35 U.S.C. 154(b) by 0 days.

(21) Appl. No.: 15/945,915

(22) Filed: Apr. 5, 2018

(65) Prior Publication Data
US 2018/0294337 A1    Oct. 11, 2018

(30) Foreign Application Priority Data
Apr. 7, 2017    (CN) .......................... 2017 1 0223509

(51) Int. Cl.
| | | |
|---|---|---|
| *H01L 29/76* | (2006.01) | |
| *H01L 29/417* | (2006.01) | |
| *H01L 29/78* | (2006.01) | |
| *H01L 21/3065* | (2006.01) | |
| *H01L 29/66* | (2006.01) | |
| *H01L 21/265* | (2006.01) | |
| *H01L 29/08* | (2006.01) | |

(52) U.S. Cl.
CPC .. *H01L 29/41766* (2013.01); *H01L 21/26513* (2013.01); *H01L 21/3065* (2013.01); *H01L 29/0847* (2013.01); *H01L 29/417* (2013.01); *H01L 29/6681* (2013.01); *H01L 29/66795* (2013.01); *H01L 29/785* (2013.01)

(58) Field of Classification Search
CPC ............. H01L 29/0869; H01L 29/1087; H01L 29/41766; H01L 29/66636; H01L 29/0886; H01L 21/265; H01L 21/823418; H01L 21/823814
See application file for complete search history.

(56) References Cited

U.S. PATENT DOCUMENTS

| | | | |
|---|---|---|---|
| 7,754,556 B2 * | 7/2010 | Feudel | .............. H01L 29/78621 438/199 |
| 9,601,574 B2 * | 3/2017 | Kwok | ................. H01L 29/0847 |

* cited by examiner

*Primary Examiner* — Hsien Ming Lee
(74) *Attorney, Agent, or Firm* — Anova Law Group, PLLC

(57) ABSTRACT

Semiconductor device and fabrication method are provided. The method includes: providing a base substrate; forming gate structures on the base substrate; forming source/drain doped regions in the base substrate on sides of each gate structure, where the source/drain doped regions have recessed top surfaces and are doped with source/drain ions; and doping into the recessed top surfaces of the source/drain doped regions with contact ions to form contact doped regions in top portions of the source/drain doped regions, where the contact ions have a conductivity type same as the source/drain ions.

20 Claims, 8 Drawing Sheets

US 10,446,652 B2

SEMICONDUCTOR DEVICE AND FABRICATION METHOD THEREOF

CROSS-REFERENCES TO RELATED APPLICATION

This application claims the priority of Chinese Patent Application No. 201710223509.6, filed on Apr. 7, 2017, the content of which is incorporated herein by reference in its entirety.

TECHNICAL FIELD

The present disclosure generally relates to the field of semiconductor technologies and more particularly, relates to a semiconductor device and its fabrication method.

BACKGROUND

A metal-oxide-semiconductor (MOS) transistor is one of the most important devices in modern integrated circuits. An elementary structure of the MOS transistor includes: a semiconductor substrate, gate structures on a surface of the semiconductor substrate, source doped regions in the semiconductor substrate on one side of the gate structures and drain doped regions in the semiconductor substrate on another side of the gate structures. In the MOS transistor, voltages are applied on the gate structures to control currents flowing through channels on bottoms of the gate structures and to produce on/off signals.

With continuous development in semiconductor technologies, conventional planar MOS transistors have a poor controlling ability on the channel current and serious leakage current. A fin field effect transistor (FinFET) is a multi-gate device. A FinFET usually includes fins protruding from the surface of the semiconductor substrate, gate structures covering a portion of top surfaces and sidewalls of the fins, source doped regions in the fins on one side of the gate structures, and drain doped regions in the fins of another side of the gate structures.

However, semiconductor devices formed by either planar MOS transistors or FinFETs have poor performance. The disclosed devices and methods are directed to at least partially alleviate one or more problems set forth above and to solve other problems in the art.

SUMMARY

One aspect of the present disclosure provides a fabrication method of a semiconductor device. The method includes: providing a base substrate; forming gate structures on the base substrate; forming source/drain doped regions in the base substrate on sides of each gate structure, where the source/drain doped regions have recessed top surfaces and are doped with source/drain ions; and doping into the top surfaces of the source/drain doped regions with contact ions to form contact doped regions in top portions of the source/drain doped regions, where the contact ions have a conductivity type same as the source/drain ions.

Another aspect of the present disclosure provides a semiconductor device. The semiconductor device includes: a base substrate; gate structures on the base substrate; source/drain doped regions in the base substrate on sides of each gate structure, with source/drain ions and recessed top surfaces; contact doped regions in middle/top portions of the source/drain doped regions, where the contact doped regions have contact ions with a conductivity type same as the source/drain ions in the source/drain doped regions and the recessed top surfaces of the source/drain doped regions are surfaces of the contact doped regions.

Other aspects or embodiments of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Reference will now be made in detail to exemplary embodiments of the disclosure, which are illustrated in the accompanying drawings. Wherever possible, the same reference numbers will be used throughout the drawings to refer to the same or like parts.

Figure 1:
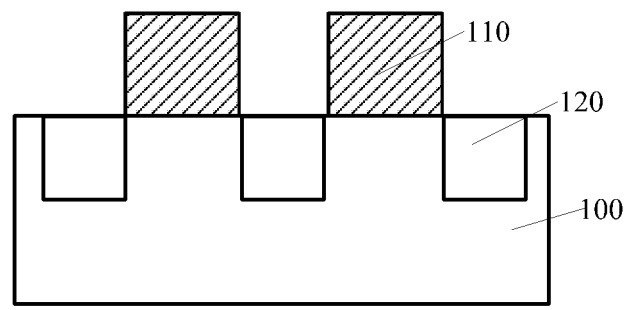
FIGS. 1-2 illustrate semiconductor structures corresponding to certain stages for forming a semiconductor device.
Figure 2:
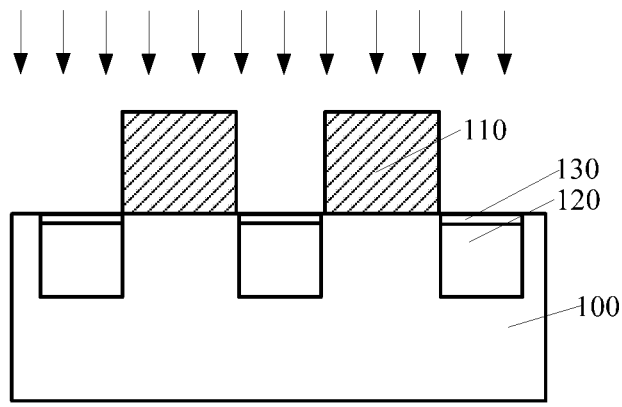

FIGS. 1-2 illustrate semiconductor structures corresponding to certain stages for forming a semiconductor device.

Referring to FIG. 1, a base substrate 100 with gate structures 110 on the base substrate 100 may be provided. Then, source/drain doped regions 120 may be formed in the base substrate 100 on sides of each gate structure 110. Referring to FIG. 2, top surfaces of the source/drain doped regions 120 may be doped with contact ions to form contact doped regions 130 in top portions of the source/drain doped regions 120.

Doping the top surfaces of the source/drain doped regions 120 with the contact ions may make a total concentration of the source/drain ions and the contact ions in the bottom parts of the source/drain doped regions 120 greater than a concentration of the source/drain ions in the source/drain doped regions 120. Correspondingly, the top portions of the source/drain doped regions 120 may have a resistance less than a resistance of the bottom parts of the source/drain doped regions 120. Subsequently, a contact potential barrier between the source/drain doped regions 120 and conducting plugs formed on the source/drain doped regions 120 may be reduced. The central parts and marginal parts of the source/drain doped regions 120 may be at the same level.

With continuous decrease of the critical dimensions of the semiconductor devices, a distance between adjacent gate structures 110 also continuously decreases. Correspondingly, a size of the source/drain doped regions 120 along a direction of the length of the channels continuously decreases, and the resistance of the source/drain doped regions 120 increases when the source/drain doped regions 120 conduct the electrical currents along a direction from the bottom parts to the top portions of the source/drain doped regions 120. Ultimately, an electrical current crowding effect happens in the source/drain doped regions 120 along the direction from the bottom parts to the top portions.

The present disclosure provides a semiconductor device and its fabricating method. The method includes: providing a base substrate with gate structures on the base substrate; forming source/drain doped regions in the base substrate on sides of each gate structure, where the source/drain doped regions have recessed top surfaces and are doped with source/drain ions; and doping into the recessed top surfaces of the source/drain doped regions with contact ions to form contact doped regions in top portions of the source/drain doped regions, where the contact ions have a conductivity type same as the source/drain ions.

In the present disclosure, the contact doped regions may be formed in the top portions of the source/drain doped regions and the contact ions in the contact doped regions may have a conductivity type same as the source/drain ions. A total concentration of the contact ions and the source/drain ions in the contact doped regions may be greater than a concentration of the source/drain ions in the source/drain doped regions under the contact doped regions. Correspondingly, the contact doped regions may have a smaller resistance than the source/drain doped regions under the contact doped regions, and a contact potential barrier between the source/drain doped regions and conducting plugs to be formed on the source/drain doped regions may be reduced. Because of the recessed top surfaces of the source/drain doped regions, the source/drain doped regions may have top surfaces with a large area. After forming the contact doped regions in the top portions of the source/drain doped regions, the recessed top surfaces of the source/drain doped regions may become surfaces of the contact doped regions, which may increase a surface area of the top surfaces of the contact doped regions. The contact doped regions may connect to the conducting plugs, so the increase in the top surface area of the contact doped regions may increase the contact areas between the contact doped regions and the conducting plugs. Subsequently, the current crowding effects in the source/drain doped regions along the direction from the bottom parts to the top portions may be alleviated.

FIGS. 3-9 illustrate semiconductor structures corresponding to certain stages for forming an exemplary semiconductor device according to various disclosed embodiments of the present disclosure.

Figure 3:
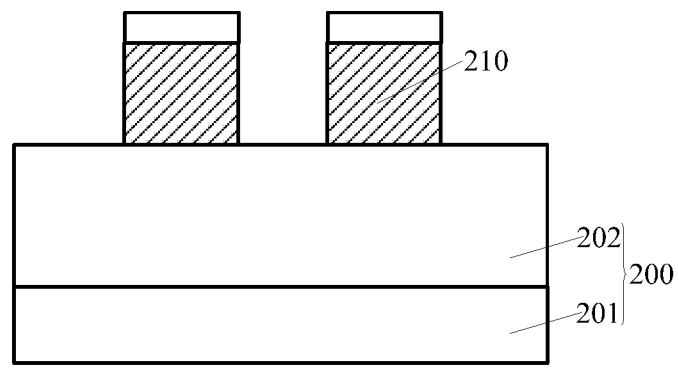
FIGS. 3-9 illustrate semiconductor structures corresponding to certain stages for forming an exemplary semiconductor device according to various disclosed embodiments of the present disclosure.
Figure 20:
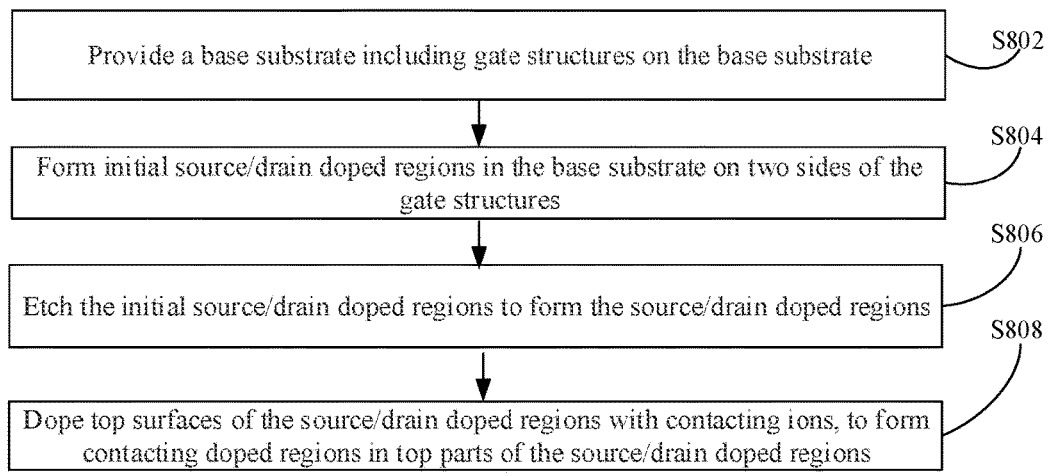
FIG. 20 illustrates an exemplary method for forming a semiconductor device according to various disclosed embodiments of the present disclosure.

Referring to FIG. 3, a base substrate 200 with gate structures 210 on the base substrate may be provided (e.g., in Step S802 in FIG. 20).

For illustration purposes, the present disclosure is described using an embodiment that the semiconductor device is a FinFET. Correspondingly, the base substrate 200 may include a semiconductor substrate 201 and fins 202 protruding from the semiconductor substrate 201.

The semiconductor substrate 201 may provide a platform for forming the semiconductor device.

In various embodiments, the semiconductor substrate 201 may be made of semiconductor materials including single crystalline silicon, polycrystalline silicon, amorphous silicon, germanium, SiGe, and/or GaAs.

In one embodiment, the fins 202 may be formed by pattern the semiconductor substrate 201. In other embodiments, the fins 202 may be formed by: after forming a fin material layer on the semiconductor substrate, patterning the fin material layer to form the fins.

In one embodiment, isolation structures may be further formed on the semiconductor substrate 201 to cover a portion of sidewalls of the fins 202. The isolation structures have top surfaces lower than top surfaces of the fins 202.

The isolation structures may be made of $SiO_2$.

In other embodiments, the semiconductor device may be a planar MOS transistor, and the base substrate 200 may be a planar semiconductor substrate.

The gate structures 210 may include gate dielectric layers on the base substrate 200 and gate layers on the gate dielectric layers.

The gate dielectric layers may be made of $SiO_2$ or a high-K (K is greater than 3.9) dielectric material.

The gate layers may be made of polycrystalline silicon or a metal.

In one embodiment, the gate structures 201 may cross the fins 202, and may cover a portion of sidewalls and a portion of top surfaces of the fins 202. The gate dielectric layers may cross the fins 202, and may be located on a portion of the isolation structures to cover a portion of sidewalls and a portion of top surfaces of the fins 202.

In one embodiment, a hard mask layer may be further formed on top surfaces of the gate structures 210. The hard mask layer may be made of SiN.

The hard mask layer may protect the top surfaces of the gate structures 210 in a subsequent contact ions implantation process.

Subsequently, the source/drain doped regions may be formed in the base substrate 200 on sides of each gate structure 210. The source/drain doped regions may have source/drain ions and may have recessed top surfaces.

FIGS. 4-7 illustrate the process for forming the source/drain doped regions.

Figure 4:
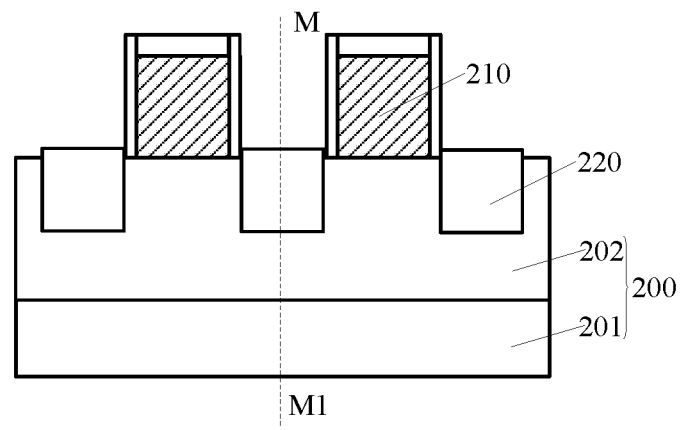
Figure 5:
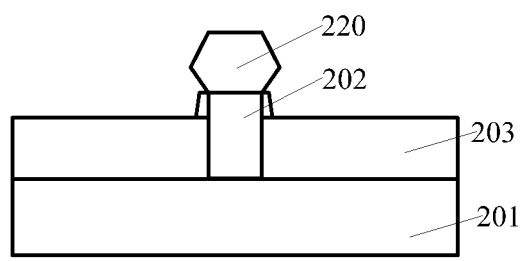

Referring to FIG. 4 based on FIG. 3, and FIG. 5 which is a cross-section view along the M-M1 direction in FIG. 4, initial source/drain doped regions 220 may be formed in the base substrate 200 on two sides of the gate structure 210 (e.g., in Step S804 in FIG. 20). The initial source/drain doped regions 220 may have source/drain ions, and may include first regions and second regions on two sides of the first regions. A direction from the second regions to the first regions may be perpendicular to an extending direction of the gate structures 210. The first regions and the second regions have top surfaces at the same level. The isolation structures 203 are shown in FIG. 5.

In one embodiment, the initial source/drain doped regions 220 may be formed in the fins 202 on sides of each gate structure 210.

In one embodiment, a process to form the initial source/drain doped regions 220 may include: forming recessions in the base substrate 200 on sides of each gate structure 210, where the recessions may be formed in the fins 202 on sides of each gate structure 210; and forming the initial source/drain doped regions 220 in the recessions by an epitaxial growth process. In other embodiments, the source/drain ions may be implanted in the base substrate 200 on sides of each gate structure 210 by an ion implantation process, to form the initial source/drain doped regions 220 in the base substrate 200 on two sides of the gate structure 210.

When the semiconductor device is an N-type device, the initial source/drain doped regions may be made of silicon doped with the source/drain ions. When the semiconductor device is a P-type device, the initial source/drain doped regions may be made of SiGe doped with the source/drain ions.

When the semiconductor device is an N-type device, the source/drain ions may be N-type conducting ions such as phosphor ions or arsenic ions. When the semiconductor device is a P-type device, the source/drain ions may be P-type conducting ions such as boron ions or indium ions.

In one embodiment, before forming the initial source/drain doped regions, a spacer material layer may be further formed on the gate structures 210 and the base substrate 200. In detail, a spacer material layer may be formed on surfaces of the gate structures 210, on surfaces of the fins 202, and on the isolation structures 203. Then the spacer material layer may be etched back, to form gate spacers on the sidewalls of the gate structures 210, and to form fin spacers on the sidewalls of the fins 202.

The gate spacers and the fin spacers correspond to the spacer material layer.

The gate spacers and the fin spacers may be made of SiN.

In one embodiment, a process for etching back the spacer material layer may also etch the base substrate 200 on sides of each gate structure to form recessions.

In the process for forming the initial source/drain doped regions 220 by an epitaxial growth process, the gate spacers and the hard mask layer may protect the gate structures 210, and prevent the growth of the material of the initial source/drain doped regions 220 on the surfaces of the gate structures 210.

Figure 6:
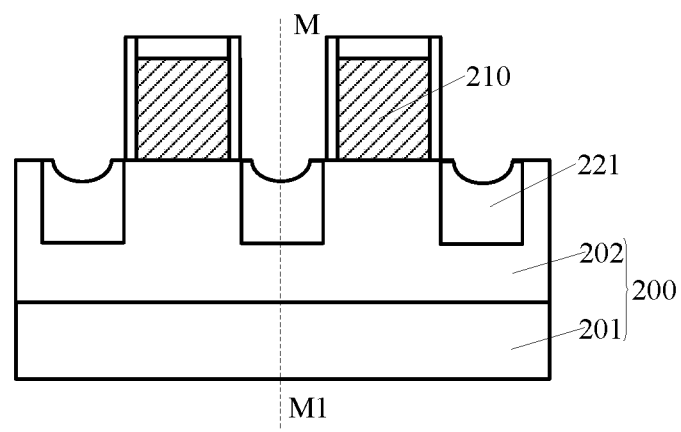
Figure 7:
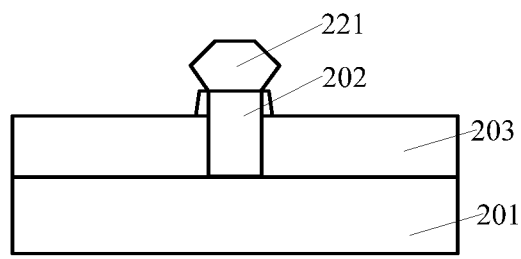

Referring to FIGS. 6-7, the initial source/drain doped regions 200 may be etched to form the source/drain doped regions 221 (e.g., in Step S806 in FIG. 20). An etching depth in the first regions is greater than an etching depth in the second regions, and the formed source/drain doped regions 221 may have the recessed top surfaces. FIG. 6 is based on FIG. 4, and FIG. 7 is a cross-section view along the M-M1 direction in FIG. 6 based on FIG. 5.

The source/drain doped regions 221 may be formed in the base substrate 200 on sides of each gate structure 210. In one embodiment, the source/drain doped regions 221 may be formed in the fins 202 on sides of each gate structure 210.

After forming the source/drain doped regions 221, the source/drain ions in the initial source/drain doped regions 220 may constitute the source/drain ions in the source/drain doped regions 221.

In other embodiments, if the semiconductor device is a planar MOS transistor, a process to form the source/drain doped regions may include: forming initial source/drain doped regions with the source/drain ions in the base substrate on two sides of the gate structure, where the initial source/drain doped regions include central regions and marginal regions surrounding the central region and the central regions have a top surface at the same level as a top surface of the marginal regions; and etching the initial source/drain doped regions to form the source/drain doped regions, wherein an etching depth of the central regions is greater than an etching depth of the marginal regions.

The initial source/drain doped regions may be etched by a dry etching process. In the dry etching process: gases may include an etching gas and a diluting gas; the etching gas may be one of or any combination between a carbon-hydrogen-fluorine based gas ($C_xH_yF_z$) and a carbon-fluorine based gas ($C_aF_b$); the diluting gas may be one of or any combination between Ar, $O_2$, $N_2$, $CO_2$ and COS; a flow rate of the etching gas may be about 10 sccm to about 100 sccm; a flow rate of the diluting gas may be about 0 sccm to about 500 sccm; a source RF power may be about 100 W to about 500 W; a bias RF power may be bout 10 W to 50 w; and a chamber pressure may be about 4 mtorr to about 100 mtorr. In $C_xH_yF_z$ and $C_aF_b$, x may be about 1 to about 7; y may be about 1 to about 7; z may be about 1 to about 7; a may be about 1 to about 7; and b may be about 1 to about 7.

The dry etching process may have a large source RF power and a large ratio between the flow rates of the etching gas and the diluting gas. Correspondingly, a plasma produced by the etching gas may have a large density, and the dry etching process may produce a large amount of byproduct. The byproducts in the dry etching process may accumulate in the recessions formed by etching the initial source/drain doped regions 220, and may accumulate more in the middle/bottom parts of sidewalls of the recessions with the progress of the dry etching process. The dry etching process may have a small bias RF power. Then, the dry etching process may consume a small amount of the accumulated byproducts, and the bias RF in the dry etching process may have a weak physical impacting effect. Correspondingly, the dry etching process may have an etching depth in the first regions greater than an etching depth in the second regions, and the source/drain doped regions 221 may have top surfaces recessed toward the inside of the source/drain doped regions 221.

Figure 8:
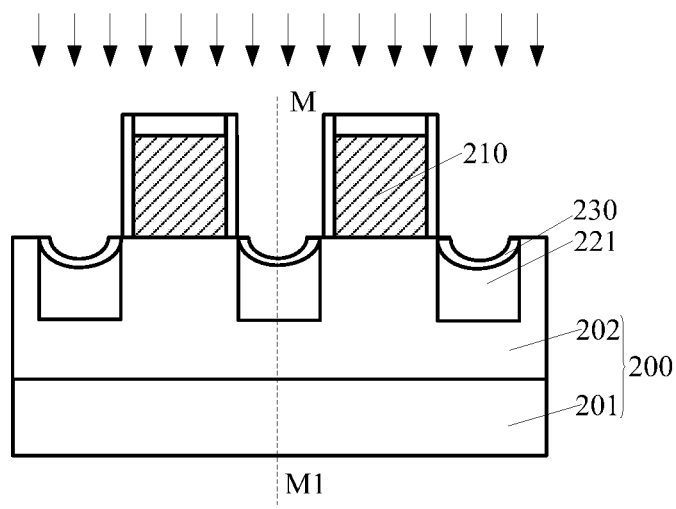
Figure 9:
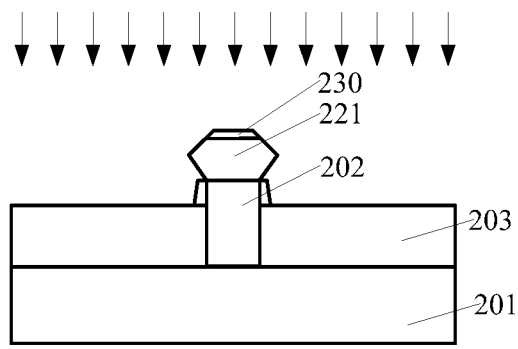

Referring to FIGS. 8-9, the top surfaces of the source/drain doped regions 221 may be doped with contact ions, to form contact doped regions 230 in the top portions of the source/drain doped regions 221 (e.g., in Step S808 in FIG. 20). FIG. 8 is based on FIG. 6, FIG. 9 is based on FIG. 7 and is a cross-section view along the M-M1 direction in FIG. 8. The contact ions may have a conductivity type same as the source/drain ions.

After forming the contact doped regions 230 in the top portions of the source/drain doped regions 221, a total concentration of the contact ions and the source/drain ions in the contact doped regions 230 may be greater than the concentration of the source/drain ions in the source/drain doped regions 221 under the contact doped regions 230. Correspondingly, the contact doped regions 230 may have a smaller resistance than the source/drain doped regions 221 under the contact doped regions 230, and a contact potential barrier between the source/drain doped regions 221 and the conducting plugs to be formed on the source/drain doped regions 221 may be reduced.

When the semiconductor device is an N-type device, the contact ions may be N-type conducting ions such as phosphor ions or arsenic ions. When the semiconductor device is a P-type device, the contact ions may be P-type conducting ions such as boron ions or indium ions.

A concentration of the contact ions in the contact doped regions 230 may be about 40% to about 80% of the concentration of the source/drain ions in the source/drain doped regions 221. If the concentration of the contact ions in the contact doped regions 230 is greater than 80% of the concentration of the source/drain ions in the source/drain doped regions 221, the process may become difficult and may be wasted; if the concentration of the contact ions in the contact doped regions 230 is smaller than 40% of the concentration of the source/drain ions in the source/drain doped regions 221, the contact potential barrier between the source/drain doped regions 221 and the conducting plugs to be formed on the source/drain doped regions 221 may become too small.

The top surfaces of the source/drain doped regions 221 may be doped with contact ions by a contact ion implantation process.

In the contact ion implantation process, the contact ions may be only implanted into the top surfaces of the source/drain doped regions 221, and a small implanting energy may be adopted. With same implanting ions, the implanting energy in the contact ion implantation process may be smaller than the implanting energy in the subsequent first ion implantation process, second ion implantation process and third ion implantation process. Because of the small implanting energy in the contact ion implantation process, the contact ion implantation process may induce very small implanting damages to the source/drain doped regions 221.

If the implanting dose of the contact ion implantation process is too large, the process may become more difficult and may be wasted. If the implanting dose of the contact ion implantation process is too small, the contact potential barrier between the source/drain doped regions 221 and the conducting plugs to be formed on the source/drain doped regions 221 may become too small.

The contact ion implantation process may have an implanting angle related to the implanting energy. The implanting angle is a sharp angle between the implanting direction and the normal direction of the semiconductor substrate 201. With a constant implanting depth, the greater implanting energy may need a greater implanting angle.

In the contact ion implantation process, the implanting energy may be about 2 keV to 5 keV, the implanting dose may be about $1E14$ atom/cm$^2$ to about $2E15$ atom/cm$^2$, and the implanting angle may be about 0 degree to about 15 degrees.

In one embodiment, the process may further include forming a metal silicide layer on the surfaces of the source/drain doped regions 221 and forming the conducting plugs on the metal silicide layer.

In the present disclosure, because of the recessed top surfaces of the source/drain doped regions 221, the source/drain doped regions 221 may have top surfaces with a large area. After forming the contact doped regions 230 in the top portions of the source/drain doped regions 221, the recessed top surfaces of the source/drain doped regions 221 may become top surfaces of the contact doped regions 230, and the top surfaces of the contact doped regions may have a large area. The contact doped regions 230 may contact the conducting plugs, so the increase in the top surface area of the contact doped regions 230 may increase the contact areas between the contact doped regions 230 and the conducting plugs. Subsequently, the current crowding effects in the source/drain doped regions 221 along the direction from the bottom parts to the top portions may be alleviated.

This disclosure embodiment also provides a semiconductor device using the above method, as illustrated in FIGS. 8-9, including: a base substrate 200; gate structures 210 on the base substrate 200; source/drain doped regions 221 in the base substrate 200 on sides of each gate structure 210, with source/drain ions and recessed top surfaces; contact doped regions 230 in the middle/top portions of the source/drain doped regions 221, where the contact doped regions 230 may have contact ions with a conductivity type same as the source/drain ions in the source/drain doped regions 221. The recessed top surfaces of the source/drain doped regions 221 may be surfaces of the contact doped regions 230.

The material and structure of the base substrate 200 can refer to the above description.

The material, structure and position of the gate structures 210 can refer to the above description.

The material and position of the source/drain doped regions 221 can refer to the above description.

When the semiconductor device is an N-type device, the contact ions may be N-type conducting ions such as phosphor ions or arsenic ions. When the semiconductor device is a P-device, the contact ions may be P-type conducting ions such as boron ions or indium ions.

The concentration of the contact ions in the contact doped regions 230 may be about 40% to about 80% of the concentration of the source/drain ions in the source/drain doped regions 221.

In the semiconductor device provided by the present disclosure, because of the recessed top surfaces of the source/drain doped regions 221, the source/drain doped regions 221 may have top surfaces with a large area. After forming the contact doped regions 230 in the top portions of the source/drain doped regions 221, the recessed top surfaces of the source/drain doped regions 221 may become surfaces of the contact doped regions 230, and the top surfaces of the contact doped regions may have a large area. The contact doped regions 230 may contact the conducting plugs, so the increase in the top surface area of the contact doped regions 230 may increase the contact areas between the contact doped regions 230 and the conducting plugs. Subsequently, the current crowding effects in the source/drain doped regions 221 along the direction from the bottom parts to the top portions may be alleviated.

The present disclosure also provides another exemplary method for forming a semiconductor device. Differences between the disclosed methods may include: forming first compensating doped regions in the base substrate under the source/drain doped regions and adjacent to the source/drain doped regions, where the first compensating doped regions have first compensating ions with a conductivity type same as the source/drain ions and a concentration less than the concentration of the source/drain ions in the source/drain doped regions. The first compensating doped regions may be formed by: before etching the initial source/drain doped regions, doping the base substrate under the initial source/drain doped regions with the first compensating ions, to form the first compensating doped regions in the base substrate under the source/drain doped regions and adjacent to the source/drain doped regions.

FIGS. 10-19 illustrate semiconductor structures corresponding to certain stages for forming another exemplary semiconductor device according to present method in various disclosed embodiments of the present disclosure.

In one embodiment, the first compensating doped regions may include first compensating layers in the base substrate under the source/drain doped regions, and second compensating layers in the base substrate between the first compensating layers and the source/drain doped regions. The first compensating layers may have first compensating ions with a first concentration smaller than the concentration of the source/drain ions in the source/drain doped regions and the second compensating layers may have second compensating ions with a second concentration greater than the first concentration but smaller than the concentration of the source/drain ions in the source/drain doped regions.

The first compensating doped regions under the initial source/drain doped regions may be formed by: doping the base substrate under the initial source/drain doped regions with the first compensating ions to form the first compensating layers with the first concentration smaller than the concentration of the source/drain ions in the source/drain doped regions, where a portion of the base substrate may exist between the first compensating layers and the initial source/drain doped regions; and doping a portion of the base substrate between the first compensating layers and the initial source/drain doped regions with the first compensating ions to form the second compensating layers with the second concentration which may be greater than the first concentration but smiler than the concentration of the source/drain ions in the source/drain doped regions.

FIGS. 10-13 illustrate the process for forming the first compensating doped regions.

Figure 10:
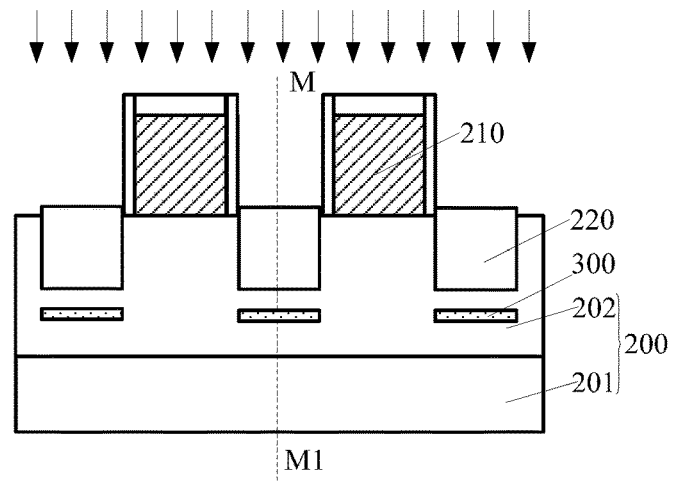
FIGS. 10-19 illustrate semiconductor structures corresponding to certain stages for forming another exemplary semiconductor device according to various disclosed embodiments of the present disclosure.
Figure 11:
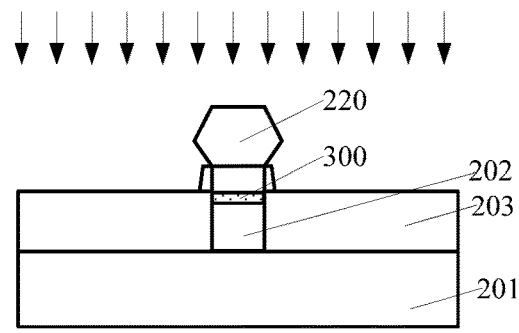
Figure 21:
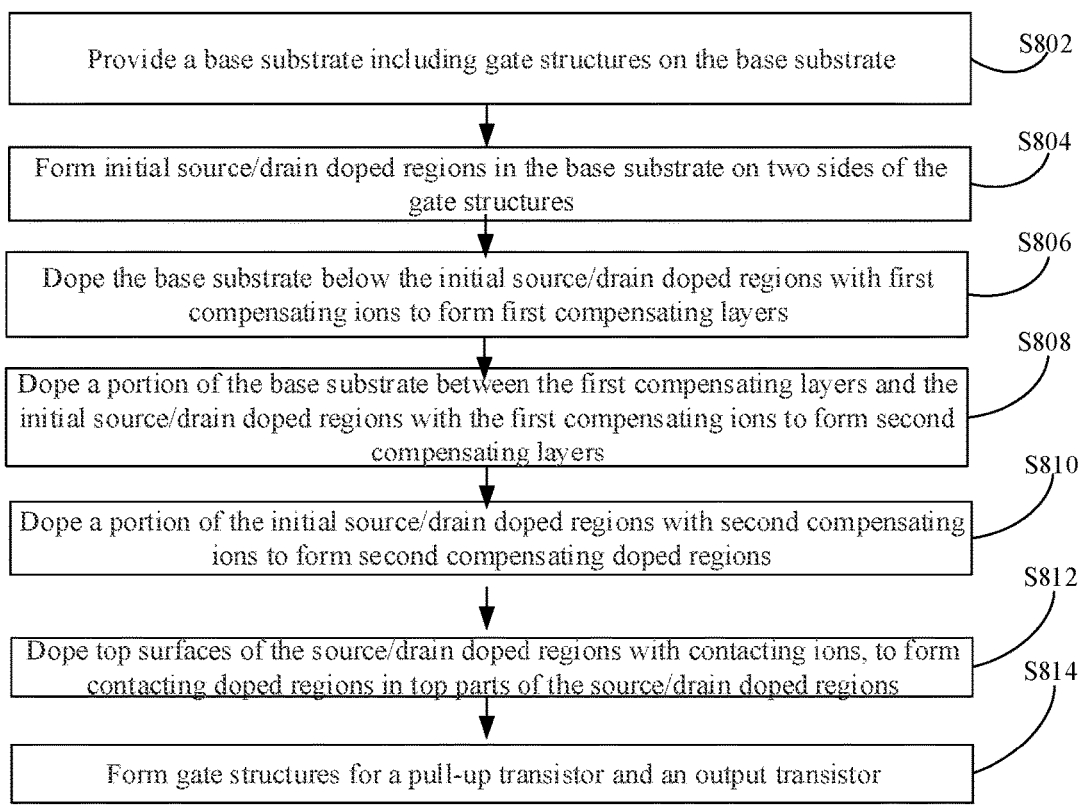
FIG. 21 illustrates another exemplary method for forming a semiconductor device according to various disclosed embodiments of the present disclosure.

FIG. 10 is based on FIG. 4. FIG. 11 is based on FIG. 5 and is a cross-section view along the M-M1 direction in FIG. 10. Referring to FIGS. 10-11, the base substrate 200 under the initial source/drain doped regions 220 may be doped with the first compensating ions to form the first compensating layers 300 in the base substrate 200 under the initial source/drain doped regions 220 (e.g., in Step S806 in FIG. 21). The compensating ions in the first compensating layers 300 may have the first concentration smaller than the concentration of the source/drain ions in the source/drain doped regions 220, and there may be a portion of the base substrate 200 between the first compensating layers 300 and the initial source/drain doped regions 220.

The fins 202 under the initial source/drain doped regions 220 may be doped with the first compensating ions to form the first compensating layers 300 in the fins 202 under the initial source/drain doped regions 220.

The first compensating layer 300 may be formed by the first ion implantation process.

When the semiconductor device is an N-type device, the first compensating ions may be N-type conducting ions such as phosphor ions or arsenic ions. When the semiconductor device is a P-type device, the first compensating ions may be P-type conducting ions such as boron ions or indium ions.

In the first ion implantation process, the first compensating ions may be implanted into the base substrate 200 under the initial source/drain doped regions 220, so the first ion implantation process have an implanting depth greater than an implanting depth in the contact ion implantation process, subsequent second ion implantation process and third ion implantation process. Correspondingly, for same implanting ions, the first ion implantation process have an implanting energy greater than the contact ion implantation process, subsequent second ion implantation process and third ion implantation process.

The first ion implantation process may use an implanting dose smaller than the subsequent second ion implantation process, and a concentration of the first compensating ions in the first compensating layers may be smaller than a concentration of the first compensating ions in the second compensating layers.

The first ion implantation process may have an implanting angle related to the implanting energy. The implanting angle is a sharp angle between the implanting direction and the normal direction of the semiconductor substrate 201. With a constant implanting depth, the greater implanting energy may need a greater implanting angle.

In the first ion implantation process, the implanting energy may be about 10 keV to 15 keV, the implanting dose may be about 1E13 atom/cm$^2$ to about 6E15 atom/cm$^2$, and the implanting angle may be about 0 degree to about 15 degrees.

In the first ion implantation process, the first compensating ions with a small atomic mass (such as phosphor ions and boron ions) may be used to reduce implanting damages on the base substrate 200.

The hard mask layer may protect the top surfaces of the gate structures 210 in the first ion implantation process.

Figure 12:
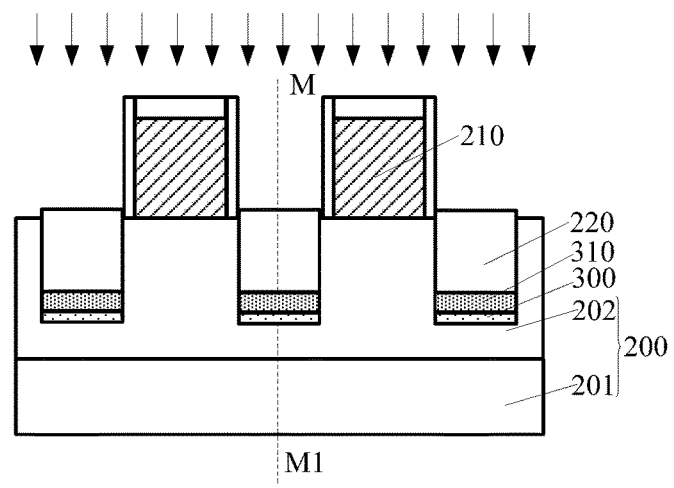
Figure 13:
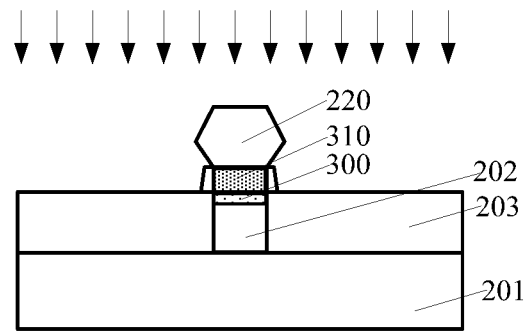

FIG. 12 is based on FIG. 10. FIG. 13 is based on FIG. 11 and is a cross-section view along M-M1 direction in FIG. 12. Referring to FIGS. 12-13, a portion of the base substrate 200 between the first compensating layers 300 and the initial source/drain doped regions 220 may be doped with the first compensating ions to form the second compensating layers 310 between the first compensating layers 300 and the initial source/drain doped regions 220 (e.g., in Step S808 in FIG. 21). The compensating ions in the second compensating layers 310 may have the second concentration smaller than the concentration of the source/drain ions in the source/drain doped regions 220 but greater than the first concentration. The second compensating layers 310 and the second compensating layers 300 together may form the first compensating doped regions.

In one embodiment, the fins 202 between the first compensating layers 300 and the initial source/drain doped regions 220 may be doped with the first compensating ions to form the second compensating layers 310 in the fins 202 between the first compensating layers 300 and the initial source/drain doped regions 220.

The second compensating layers 310 may be formed by the second ion implantation process.

In the second ion implantation process, the first compensating ions may be implanted into the base substrate 200 between the first compensating layers 300 and the initial source/drain doped regions 220, so the second ion implantation process have an implanting depth smaller than the implanting depth in the first ion implantation process, but greater than the implanting depth in the contact ion implantation process and the subsequent third ion implantation process. Correspondingly, for same implanting ions, the second ion implantation process have an implanting energy smaller than the first ion implantation process, but greater than the contact ion implantation process and the subsequent third ion implantation process.

The second ion implantation process may use an implanting dose greater than the first ion implantation process, and the concentration of the first compensating ions in the first compensating layers may be smaller than the concentration of the first compensating ions in the second compensating layers.

The second ion implantation process may have an implanting angle related to the implanting energy. The implanting angle is a sharp angle between the implanting direction and the normal direction of the semiconductor substrate 201. With a constant implanting depth, the greater implanting energy may need a greater implanting angle.

In the second ion implantation process, the implanting energy may be about 6 keV to about 11 keV, the implanting dose may be about 1E15 atom/cm$^2$ to about 5E15 atom/cm$^2$, and the implanting angle may be about 0 degree to about 15 degrees.

In the second ion implantation process, the first compensating ions with small atomic mass (such as phosphor ions and boron ions) may be used to reduce implanting damages on the base substrate 200.

The hard mask layer may protect the top surfaces of the gate structures 210 in the first ion implantation process.

In one embodiment, the isolation structures 203 may cover sidewalk of the first compensating layers 300 but expose sidewalls of the second compensating layers 310.

In other embodiments, the first compensating doped regions may have a single-layer structure and only one ion implantation process may be necessary to form the first compensating doped regions.

Figure 14:
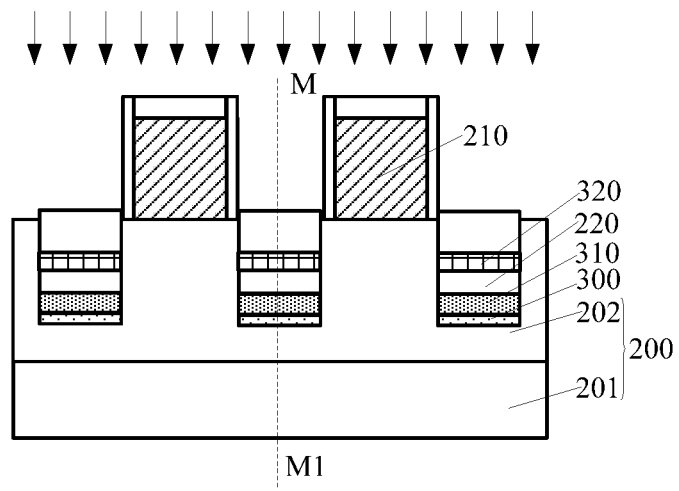
Figure 15:
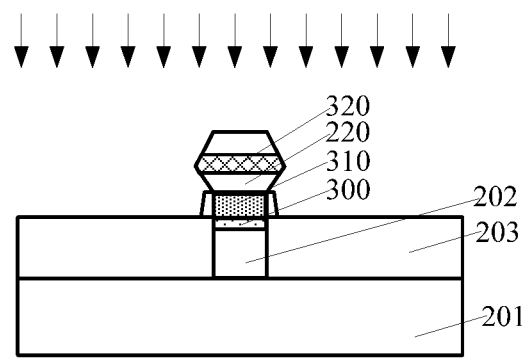

FIG. 14 is based on FIG. 12. FIG. 15 is based on FIG. 13 and is a cross-section view along the M-M1 direction in FIG. 14. Referring to FIGS. 14-15, a portion of the initial source/drain doped regions 220 may be doped with second compensating ions, to form the second compensating doped regions 320 in a portion of the initial source/drain doped regions 220 (e.g., in Step S810 in FIG. 21). The second compensating ions may have a conductivity type same as the source/drain ions.

After forming the source/drain doped regions and the contact doped regions, the second compensating doped regions 320 may be located in the source/drain doped regions under the contact doped regions. The second compensating ions may have the concentration smaller than the concentration of the contact ions in the contact doped regions.

Forming the second compensating doped regions 320 may reduce the resistance of the source/drain doped regions under the contact doped regions, and may further alleviate the current crowding effect in the source/drain doped regions along a direction from the bottom parts to the top portions.

The second compensating ions may have a concentration less than the concentration of the contact ions in the contact doped regions. Correspondingly, a total concentration of the second compensating ions and the source/drain ions in the second compensating doped regions 320 may be less than a total concentration of the contact ions and the source/drain ions in the contact doped regions. Then a probability that the second compensating doped regions 320 on sides of each gate structure 210 are respectively connected to the depletion layers in the channel regions may be reduced.

The second compensating doped regions 320 may be formed by a third ion implantation process.

When the semiconductor device is an N-type device, the second compensating ions may be N-type conducting ions such as phosphor ions or arsenic ions. When the semiconductor device is a P-type device, the second compensating ions may be P-type conducting ions such as boron ions or indium ions.

In the third ion implantation process, the second compensating ions may be implanted into the initial source/drain doped regions 220, so the third ion implantation process may have an implanting depth greater than the implanting depth in the subsequent contact ion implantation process. Correspondingly, for same implanting ions, the third ion implantation process may use an implanting energy greater than the contact ion implantation process, but smaller than the first ion implantation process and the second ion implantation process.

The third ion implantation process may use an implanting dose smaller than the implanting dose of the contact ion implantation process, and the concentration of the second compensating ions in the second compensating doped regions 320 may be smaller than the concentration of the contact ions in the contact doped regions.

The third ion implantation process may have an implanting angle related to the implanting energy. The implanting angle is a sharp angle between the implanting direction and the normal direction of the semiconductor substrate 201. With a constant implanting depth, the greater implanting energy may need a greater implanting angle.

In the third ion implantation process, the implanting energy may be about 4 keV to about 6 keV, the implanting dose may be about 0.5E14 atom/$cm^2$ to about 1.5E15 atom/$cm^2$, and the implanting angle may be about 0 degree to about 15 degrees.

In the third ion implantation process, the second compensating ions with small atomic mass (such as phosphor ions and boron ions) may be used to reduce implanting damages on the base substrate 200.

The hard mask layer may protect the top surfaces of the gate structures 210 in the first ion implantation process.

In one embodiment, the second compensating doped regions 320 may be formed after forming the first compensating doped regions. In other embodiment, the second compensating doped regions may be formed without forming the first compensating doped regions, or the first compensating doped regions may be formed without forming the second compensating doped regions.

Figure 16:
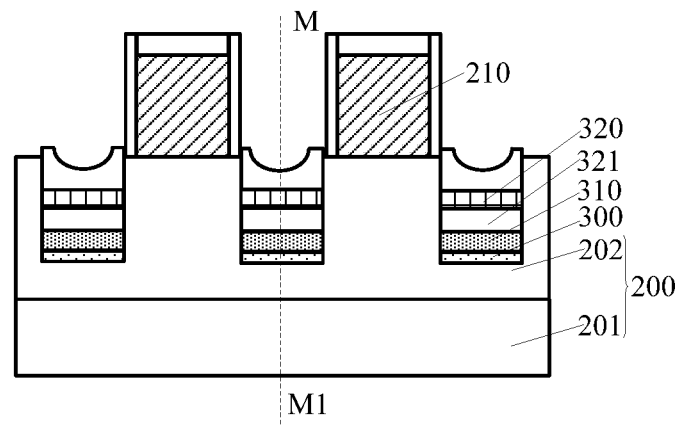
Figure 17:
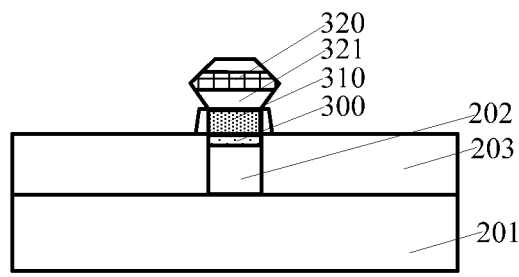

FIG. 16 is based on FIG. 14. FIG. 17 is based on FIG. 15 and is a cross-section view along M-M1 direction in FIG. 16. Referring to FIGS. 16-17, the initial source/drain doped regions 220 may be etched to form the source/drain doped regions 321 (e.g., in Step S812 in FIG. 21). The etching depth on the first regions may be greater than the etching depth on the second regions, and the source/drain doped regions 321 may have recessed top surfaces.

The etching process for etching the initial source/drain doped regions 220 can refer to the above description.

After forming the source/drain doped regions 321, the source/drain ions in the initial source/drain doped regions 220 may constitute the source/drain ions in the source/drain doped regions 321.

After forming the source/drain doped regions 321, the first compensating layers 300 may be located in the base substrate 200 under the source/drain doped regions 321, and the second compensating layers 310 may be located in the base substrate 200 between the first compensating layers 300 and the source/drain doped regions 321. The first concentration may be smaller than the concentration of the source/drain ions in the source/drain doped regions 321, and the second concentration may be smaller than a concentration of the source/drain ions in the source/drain doped regions 321 but greater than the first concentration.

After forming the source/drain doped regions 321, the second compensating doped regions 320 may be located in the source/drain doped regions 321.

In the present disclosure, forming the first compensating doped regions may reduce a resistance of the base substrate 200 under but close to the source/drain doped regions 321, when the source/drain doped regions 321 conduct the currents from the bottom parts to the bottom parts, and then alleviate the current crowding effect in the base substrate 200 under but close to the source/drain doped regions 321.

In the present disclosure, the first concentration of the first compensating ions in the first compensating doped regions may be smaller than the concentration of the source/drain ions in the source/drain doped regions 321. Correspondingly, a degree that the first compensating ions in the first compensating doped regions diffuse into the channel regions may be smaller than a degree that the source/drain ions in the source/drain doped regions 321 diffuse into the channel regions, and a concentration of the conducting ions in the channel regions adjacent to the first compensating doped regions may be smaller than a concentration of the conducting ions in the channel regions adjacent to the source/drain doped regions 321. Also, depletion layers formed by the channel regions and the first compensating doped regions may have a width smaller than depletion layers formed by the channel regions and the source/drain doped regions 321. Subsequently, a probability that the first compensating doped regions on sides of each gate structure 210 respectively connect to the depletion layers in the channel regions may be reduced, and the short channel effect may be alleviated.

In the present disclosure, the first compensating doped regions may include the first compensating layers 300 and the second compensating layers 310. The concentration of the first compensating ions in the first compensating layers may be smaller than the concentration of the first compensating ions in the second compensating layers 310. Correspondingly, a degree that the first compensating ions in the first compensating layers diffuse into the channel regions may be smaller than a degree that the first compensating ions in the second compensating layers 310 diffuse into the channel regions, and a concentration of the conducting ions in the channel regions adjacent to the first compensating layers may be smaller than a concentration of the conducting ions in the channel regions adjacent to the second compensating layers 310. Also, depletion layers formed by the channel regions and the first compensating layers 300 may have a width smaller than depletion layers formed by the channel regions and the second compensating layers 310. Subsequently, a probability that the first compensating doped regions on sides of each gate structure 210 respectively connect to the depletion layers in the channel regions may be reduced further, and the short channel effect may be alleviated further.

Figure 18:
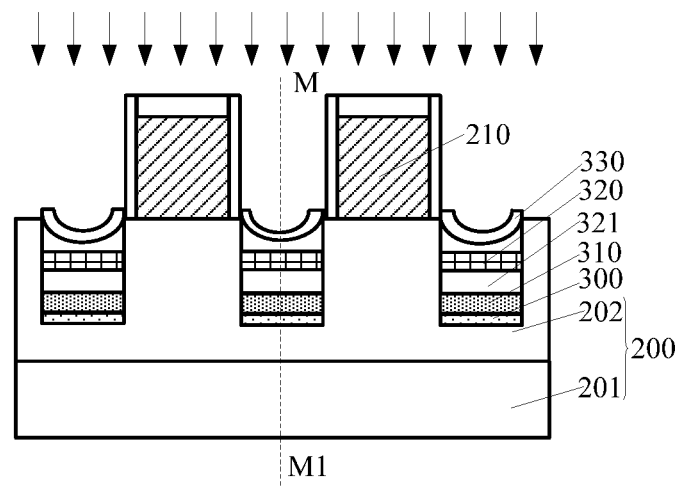
Figure 19:
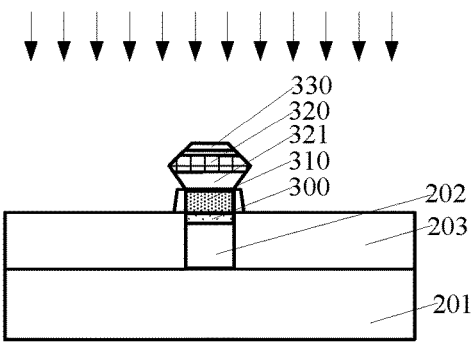

FIG. 18 is based on FIG. 16. FIG. 19 is based on FIG. 17 and is a cross-section view along the M-M1 direction in FIG. 18. Referring to FIGS. 18-19, the top surfaces of the source/drain doped regions 321 may be doped with contact ions, to form contact doped regions 330 in the top portions of the source/drain doped regions 321 (e.g., in Step S814 in FIG. 21). The contact ions may have a conductivity type same as the source/drain ions.

After forming the contact doped regions 330, the second compensating doped regions 320 may be located in the source/drain doped regions 321 under the contact doped regions 330.

The process for forming the contact doped regions 330 in the top portions of the source/drain doped regions 321 can refer to the above descriptions.

In one embodiment, the concentration of the second compensating ions in the second compensating doped regions may be about 50% to about 70% of the concentration of the contact ions in the contact doped regions.

In one embodiment, the method may further include forming a metal silicide layer on the surface of the source/drain doped regions 321 and forming conducting plugs in the metal silicide layer.

This disclosure embodiment also provides a semiconductor device using the above method, as illustrated in FIGS. 18-19, including: a base substrate 200; gate structures 210 on the base substrate 200; source/drain doped regions 321 in the base substrate 200 on sides of each gate structure 210, with source/drain ions and recessed top surfaces; contact doped regions 330 in the middle/top portions of the source/drain doped regions 321, where the contact doped regions 330 may have contact ions with a conductivity type same as the source/drain ions in the source/drain doped regions 321. The recessed top surfaces of the source/drain doped regions 321 may be surfaces of the contact doped regions 330.

The material and structure of the base substrate 200 can refer to the above description.

The material, structure and position of the gate structures 210 can refer to the above description in the present application. The material and position of the source/drain doped regions 321 can refer to the above description.

When the semiconductor device is an N-type device, the contact ions may be N-type conducting ions such as phosphor ions or arsenic ions. When the semiconductor device is a P-type device, the contact ions may be P-type conducting ions such as boron ions or indium ions.

The concentration of the contact ions in the contact doped regions 330 may be about 40% to about 80% of the concentration of the source/drain ions in the source/drain doped regions 321.

The semiconductor device may further include including first compensating doped regions in the base substrate 200 under the source/drain doped regions 321 and adjacent to the source/drain doped regions 321. The first compensating doped regions have first compensating ions which have a conductivity type same as the source/drain ions and have a concentration less than the concentration of the source/drain ions in the source/drain doped regions 321.

The first compensating doped regions may include first compensating layers 300, and second compensating layers 310 between the first compensating layers 300 and the source/drain doped regions 321. The first compensating layers may have first compensating ions with a first concentration smaller than the concentration of the source/drain ions in the source/drain doped regions 321. The second compensating layers have second compensating ions with a second concentration which may be greater than the first concentration but than the concentration of the source/drain ions in the source/drain doped regions 321.

In other embodiments, the first compensating doped regions may have a single-layer structure.

In one embodiment, the second concentration may be about 30% to 70% of the concentration of the source/drain ions in the source/drain doped regions 321, and the first concentration may be about 30% to 70% of the second concentration.

The semiconductor device may further include second compensating doped regions 320 in the source/drain doped regions 321 under the contact doped regions 330. The second compensating doped regions 320 have second compensating ions which have a same conductivity type as the source/drain ions and have a concentration less than the concentration of the contact ions in the contact doped regions 321.

In one embodiment, the concentration of the second compensating ions in the second compensating doped regions 320 may be about 50% to about 70% of the concentration of the contact ions in the contact doped regions 330.

In the present disclosure, after forming the contact doped regions 230 in the top portions of the source/drain doped regions 221, a total concentration of the contact ions and the source/drain ions in the contact doped regions 230 may be greater than the concentration of the source/drain ions in the source/drain doped regions 221 under the contact doped regions 230. Correspondingly, the contact doped regions 230 may have a smaller resistance than the source/drain doped regions 221 under the contact doped regions 230, and a contact potential barrier between the source/drain doped regions 221 and the conducting plugs to be formed on the source/drain doped regions 221 may be reduced. Because of the recessed top surfaces of the source/drain doped regions 221, the source/drain doped regions 221 may have top surfaces with a large area. After forming the contact doped regions 230 in the top portions of the source/drain doped regions 221, the recessed top surfaces of the source/drain doped regions 221 may become top surfaces of the contact doped regions 230, and the top surfaces of the contact doped regions may have a large area. The contact doped regions 230 may contact the conducting plugs, so the increase in the top surface area of the contact doped regions 230 may increase the contact areas between the contact doped regions 230 and the conducting plugs. Subsequently, the current crowding effects in the source/drain doped regions may be alleviated.

In the present disclosure, the first compensating doped regions may be formed in the base substrate under the source/drain doped regions and may be adjacent to the source/drain doped regions. The first concentration of the first compensating ions in the first compensating doped regions may be smaller than the concentration of the source/drain ions in the source/drain doped regions 321. Forming the first compensating doped regions may reduce a resistance of the base substrate 200 under but close to the source/drain doped regions 321, when the source/drain doped regions 321 conduct the currents from the bottom parts to the bottom parts, and then alleviate the current crowding effect in the base substrate 200 under but close to the source/drain doped regions 321. Correspondingly, a degree that the first compensating ions in the first compensating doped regions diffuse into the channel regions may be smaller than a degree that the source/drain ions in the source/drain doped regions 321 diffuse into the channel regions, and a concentration of the conducting ions in the channel regions adjacent to the first compensating doped regions may be smaller than a concentration of the conducting ions in the channel regions adjacent to the source/drain doped regions 321. Also, depletion layers formed by the channel regions and the first compensating doped regions may have a width smaller than depletion layers formed by the channel regions and the source/drain doped regions 321. Subsequently, a probability that the first compensating doped regions on sides of each gate structure 210 respectively connect to the depletion layers in the channel regions may be reduced, and the short channel effect may be alleviated.

In the present disclosure, the first compensating doped regions may include the first compensating layers 300 and the second compensating layers 310. The concentration of the first compensating ions in the first compensating layers may be smaller than the concentration of the first compensating ions in the second compensating layers 310. Correspondingly, a degree that the first compensating ions in the first compensating layers diffuse into the channel regions may be smaller than a degree that the first compensating ions in the second compensating layers 310 diffuse into the channel regions, and a concentration of the conducting ions in the channel regions adjacent to the first compensating layers may be smaller than a concentration of the conducting ions in the channel regions adjacent to the second compensating layers 310. Also, depletion layers formed by the channel regions and the first compensating layers 300 may have a width smaller than depletion layers formed by the channel regions and the second compensating layers 310. Subsequently, a probability the first compensating doped regions on sides of each gate structure 210 respectively connect to the depletion layers in the channel regions may be reduced further, and the short channel effect may be alleviated further.

The embodiments disclosed herein are exemplary only. Other applications, advantages, alternations, modifications, or equivalents to the disclosed embodiments are obvious to those skilled in the art and are intended to be encompassed within the scope of the present disclosure.

What is claimed is:

1. A fabrication method of a semiconductor device, comprising:
   providing a base substrate;
   forming gate structures on the base substrate;
   forming source/drain doped regions in the base substrate on sides of each gate structure, wherein the source/drain doped regions have recessed top surfaces and are doped with source/drain ions;
   doping into the recessed top surfaces of the source/drain doped regions with contact ions to form contact doped regions in top portions of the source/drain doped regions, wherein the contact ions have a conductivity type same as the source/drain ions; and
   forming first compensating doped regions in the base substrate under the source/drain doped regions and adjacent to the source/drain doped regions, wherein
   the first compensating doped regions include first compensating layers, in the base substrate under the source/drain doped regions, and second compensating layers, in the base substrate between the first compensating layers and the source/drain doped regions.

2. The fabrication method according to claim 1, wherein:
   doping into the recessed top surfaces of the source/drain doped regions with contact ions includes a contact ion implantation process, using an implanting energy of about 2 keV to about 5 keV, an implanting dose of about 1E14 atom/cm$^2$ to about 2E15 atom/cm$^2$; and an implanting angle of about 0 degree to about 15 degrees between an implanting direction and normal direction of the base substrate.

3. The fabrication method according to claim 1, wherein a concentration of the contact ions in the contact doped regions is about 40% to 80% of a concentration of the source/drain ions in the source/drain doped regions.

4. The fabrication method according to claim 1, wherein the contact ions are N-type when the semiconductor device is N-type and the contact ions are P-type when the semiconductor device is P-type.

5. The fabrication method according to claim 1, wherein:
   when the semiconductor device is a planar metal-oxide-semiconductor transistor, forming the source/drain doped region includes:
     forming an initial source/drain doped region with the source/drain ions in the base substrate on each side of the gate structure, wherein the initial source/drain doped region includes a central region and a marginal region surrounding the central region and the central region has a top surface coplanar with the marginal region; and
     etching the initial source/drain doped region to form the source/drain doped region, wherein an etching depth of the central region is deeper than an etching depth of the marginal region; and
   when the semiconductor device is a fin field effect transistor, forming the source/drain doped region includes:
     forming an initial source/drain doped region with the source/drain ions in the base substrate on each side of the gate structure, wherein the initial source/drain doped region includes a first region and a second region on two sides of the first region, and a direction from the second region to the first region is perpendicular to an extending direction of the gate structure, and the first region and the second region have a coplanar top suface; and
     etching the initial source/drain doped region to form the source/drain doped region, wherein an etching depth of the first regions is deeper than an etching depth of the second regions.

6. The fabrication method according to claim 5, wherein:
   the initial source/drain doped region is etched by a dry etching process using:

gases including a etching gas and a diluting gas, the etching gas including a carbon-hydrogen-fluorine based gas, a carbon-fluorine based gas, or a combination thereof, the diluting gas including Ar, $N_2$, $C_{O2}$, COS, or a combination thereof;

a flow rate of the etching gas of about 10 sccm to about 100 sccm;

a flow rate of the diluting gas of about 0 sccm to about 500 sccm;

a source RF power of about 100 W to about 500 W;

a bias RF power of bout 10 W to 50 w; and a chamber pressure of about 4 mtorr to about 100 mtorr.

7. The fabrication method according to claim 5, wherein the first compensating doped regions have first compensating ions having a conductivity type same as the source/drain ions and having a concentration less than the concentration of the source/drain ions in the source/drain doped regions; and wherein the first compensating doped regions are formed by: before etching the initial source/drain doped regions, doping the base substrate under the initial source/drain doped regions with the first compensating ions, to form the first compensating doped regions in the base substrate under the source/drain doped regions and adjacent to the source/drain doped regions.

8. The fabrication method according to claim 7, wherein:

the first compensating layers have first compensating ions with a first concentration less than the concentration of the source/drain ions in the source/drain doped regions;

the second compensating layers have second compensating ions with a second concentration greater than the first concentration and less than the concentration of the source/drain ions in the source/drain doped regions; and the first compenasting, doped regions are formed by:
  doping the base substrate under the initial source/drain doped regions with the first compensating ions to form the first compensating layers with the first concentration less than the concentration of the source/drain ions in the source/drain doped regions, having a portion of the base substrate between the first compensating layers and the initial source/drain doped regions; and
  doping a portion of the base substrate between the first compensating layers and the initial source/drain doped regions with the first compensating ions to form the second compensating layers with the second concentration greater than the first concentration and smaller than the concentration of the source/drain ions in the source/drain doped regions.

9. The fabrication method according to claim 8, wherein:

the second concentration is about 30% to 70% of the concentration of the source/drain ions in the source/drain doped regions, and the first concentration is about 30% to 70% of the second concentration.

10. The fabrication method according to claim 9, wherein:

the first compensating layers are formed by a first ion implantation process using an implanting energy of about 10 keV to about 50 keV, an implanting dose of about 1E13 atom/ $cm^2$ to about 6E14 atom/ $cm^2$, and an implanting angle of about 0 degree to about 15 degrees; and the second compensating layers are formed by a second ion implantation process using an implanting energy of about 6 keV to about 11 keV, an implanting dose of about 1E15 atom/ $cm^2$ to about 5E15 atom/ $cm^2$, and an implanting angle of about 0 degrees to about 15 degrees between an implanting direction and normal direction of the base substrate.

11. The fabrication method according to claim 5, further including:

forming second compensating doped regions in the source/drain doped regions under the contact doped regions by doping a portion of the initial source/drain doped regions with second compensating ions before etching the initial source/drain doped regions, wherein the second compensating ions have a conductivity type same as the source/drain ions and have a concentration less than the concentration of the contact ions in the contact doped regions.

12. The fabrication method according to claim 11, wherein a concentration of the second compensating ions is about 50% to about 70% of a concentration of the contact ions in the contact doped regions.

13. The fabrication method according to claim 11; wherein:

the second compensating doped regions are formed by a third ion implantation process using an implanting energy is of about 4 keV to about 6 keV, an implanting dose of about 0.5E14 atom/ $cm^2$ to about 1.5E15 atom/ $cm^2$, and an implanting angle of about 0 degree to about 15 degrees between an implanting direction and normal direction of the base substrate.

14. A semiconductor device, comprising:

a base substrate;

a gate structure on the base substrate;

source/drain doped regions in the base substrate on sides of the gate structure, wherein the source/drain doped regions have recessed top surfaces and are doped with source/drain ions; and contact doped regions in the top portions of the source/drain doped region, with contact ions having a conductivity type same as the source/drain ions, wherein the recessed top surfaces of the source/drain doped regions are surfaces of the contact doped regions; and first compensating doped regions in the base substrate under the source/drain doped, regions and adjacent to the source/drain doped regions, wherein:

the first compensating doped regions include first compensating lavers, in the base substrate under the source/drain doped regions, and second compensating layers, in the base substrate between the first compensating layers and the source/drain doped regions.

15. The semiconductor device according to claim 14, wherein a concentration of the contact ions in the contact doped regions is about 40% to about 80% of a concentration of the source/drain ions in the source/drain doped regions.

16. The semiconductor device according to claim 14, wherein the first compensating doped regions have first compensating ions which have a conductivity type same as the source/drain ions and have a concentration less than the concentration of the source/drain ions in the source/drain doped regions.

17. The semiconductor device according to claim 14, further including second compensating doped regions in the source/drain doped regions under the contact doped regions, wherein the second compensating doped regions have second compensating ions which have a conductivity type same as the source/drain ions and have a concentration less than the concentration of the contact ions in the contact doped regions.

18. The semiconductor device according to claim 17, wherein the concentration of the second compensating ions in the second compensating doped regions is about 50% to about 70% of the concentration of the contact ions in the contact doped regions.

19. A semiconductor device, comprising:
- a base substrate;
- a gate structure on the base substrate;
- source/drain doped regions in the base substrate on sides of the gate structure, wherein the source/drain doped regions have recessed top surfaces and are doped with source/drain ions;
- contact doped regions in the top portions of the source/drain doped region, with contact ions having a conductivity type same as the source/drain ions, wherein the recessed top surfaces of the source/drain doped regions are surfaces of the contact doped regions; and
- first compensating doped regions in the base substrate under the source/drain doped regions and adjacent to the source/drain doped regions, wherein the first compensating doped regions have first compensating ions which have a conductivity type same as the source/drain ions and have a concentration less than the concentration of the source/drain ions in the source/drain doped regions, wherein:
  - the first compensating doped regions include first compensating layers in the base substrate under the source/drain doped regions, and second compensating layers in the base substrate between the first compensating layers and the source/drain doped regions; and
  - the first compensating layers have first compensating ions with a first concentration less than the concentration of the source/drain ions in the source/drain doped regions; and
  - the second compensating layers have second compensating ions with a second concentration greater than the first concentration but less than the concentration of the source/drain ions in the source/drain doped regions.

20. The semiconductor device according to claim 19, wherein the second concentration is about 30% to 70% of the concentration of the source/drain ions in the source/drain doped regions, and the first concentration is about 30% to 70% of the second concentration.

\* \* \* \* \*